(12) United States Patent
Lower et al.

(10) Patent No.: US 9,197,024 B1
(45) Date of Patent: *Nov. 24, 2015

(54) METHOD OF REINFORCING A HERMETIC SEAL OF A MODULE

(75) Inventors: Nathan P. Lower, North Liberty, IA (US); David M. Brower, Marion, IA (US); Ross K. Wilcoxon, Cedar Rapids, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 697 days.

This patent is subject to a terminal disclaimer.

(21) Appl. No.: 13/071,316

(22) Filed: Mar. 24, 2011

Related U.S. Application Data (60) Division of application No. 11/784,158, filed on Apr. 5, 2007, now Pat. No. 7,915,527, which is a continuation-in-part of application No. 11/508,782, filed on Aug. 23, 2006, now Pat. No. 8,076,185.

(51) Int. Cl.
*H05K 3/00* (2006.01)
*H01R 43/02* (2006.01)
*H01R 43/20* (2006.01)

(52) U.S. Cl.
CPC ............... *H01R 43/02* (2013.01); *H01R 43/20* (2013.01)

(58) Field of Classification Search
CPC ............... H05K 2201/09872; H05K 2203/13; H05K 2203/1305; H05K 2203/1316; H01R 43/02; H01R 43/20; H01R 43/18
USPC .......................................... 29/25.42; 438/127
See application file for complete search history.

(56) References Cited

U.S. PATENT DOCUMENTS

| 3,170,813 A | 2/1965 | Duncan et al. |
| 3,508,974 A | 4/1970 | Bressler |

(Continued)

FOREIGN PATENT DOCUMENTS

| JP | 60-013875 | 1/1900 |
| JP | 55-120083 | 9/1980 |

(Continued)

OTHER PUBLICATIONS

Notice of Allowance for U.S. Appl. No. 11/732,982, mail date Jul. 10, 2013, 6 pages.

(Continued)

*Primary Examiner* — Carl Arbes
(74) *Attorney, Agent, or Firm* — Donna P. Suchy; Daniel M. Barbieri (57) ABSTRACT

The present invention is directed to low-cost, low-processing temperature, and simple reinforcement, repair, and corrosion protection for hermetically sealed modules and hermetic connectors. A thin layer of glass is applied over the module's seal or the connector' glass frit. The layer of glass comprises an alkali silicate glass. The layer of glass is produced from a material which is a low viscosity liquid at room temperature prior to curing and is cured at low temperatures (typically no more than about 160 degrees Celsius). Subsequent to curing, the layer of glass is intimately bonded to the seal, watertight, and is stable from about negative two-hundred forty-three degrees Celsius to at least about seven-hundred twenty-seven degrees Celsius. The glass layer provides corrosion protection, seals any existing leaks, and possesses good flexibility and adhesion. The resulting bond is hermetic with good aqueous durability and strength similar to that of monolithic structures.

19 Claims, 5 Drawing Sheets

(56) References Cited

U.S. PATENT DOCUMENTS

| | | |
|---|---|---|
| 3,654,528 A | 4/1972 | Barkan |
| 3,723,790 A | 3/1973 | Dumbaugh et al. |
| 3,812,404 A | 5/1974 | Barkan et al. |
| 3,830,892 A | 8/1974 | Wada |
| 4,177,015 A | 12/1979 | Davidson |
| 4,294,658 A | 10/1981 | Humphreys et al. |
| 4,410,874 A | 10/1983 | Scapple et al. |
| 4,505,644 A | 3/1985 | Meisner et al. |
| 4,512,808 A | 4/1985 | Pesch et al. |
| 4,513,029 A | 4/1985 | Sakai |
| 4,560,084 A | 12/1985 | Wolfson |
| 4,572,924 A | 2/1986 | Wakely et al. |
| 4,622,433 A | 11/1986 | Frampton |
| 4,678,868 A * | 7/1987 | Kraska et al. .......... 174/152 GM |
| 4,761,518 A | 8/1988 | Butt et al. |
| 4,765,948 A | 8/1988 | Deluca et al. |
| 4,773,826 A | 9/1988 | Mole |
| 4,802,531 A | 2/1989 | Nathenson et al. |
| 4,882,212 A | 11/1989 | Singhdeo et al. |
| 4,940,858 A * | 7/1990 | Taylor et al. .......... 174/152 GM |
| 4,963,503 A | 10/1990 | Aoki et al. |
| 5,041,342 A | 8/1991 | Umeda et al. |
| 5,136,365 A | 8/1992 | Pennisi et al. |
| 5,140,109 A | 8/1992 | Matsumoto et al. |
| 5,184,211 A | 2/1993 | Fox |
| 5,195,231 A | 3/1993 | Fanning et al. |
| 5,232,970 A | 8/1993 | Solc et al. |
| 5,244,726 A | 9/1993 | Laney et al. |
| 5,265,136 A | 11/1993 | Yamazaki et al. |
| 5,288,769 A | 2/1994 | Papageorge et al. |
| 5,315,155 A | 5/1994 | O'Donnelly et al. |
| 5,405,808 A | 4/1995 | Rostoker et al. |
| 5,502,889 A | 4/1996 | Casson et al. |
| 5,581,286 A | 12/1996 | Hayes et al. |
| 5,650,759 A * | 7/1997 | Hittman et al. .......... 333/182 |
| 5,686,703 A | 11/1997 | Yamaguchi |
| 5,690,837 A | 11/1997 | Nakaso et al. |
| 5,702,963 A | 12/1997 | Vu et al. |
| 5,863,605 A | 1/1999 | Bak-Boychuk et al. |
| 5,916,944 A | 6/1999 | Camilletti et al. |
| 5,958,794 A | 9/1999 | Bruxvoort et al. |
| 5,965,947 A | 10/1999 | Nam et al. |
| 5,991,351 A | 11/1999 | Woolley |
| 6,010,956 A | 1/2000 | Takiguchi et al. |
| 6,019,165 A | 2/2000 | Batchelder |
| 6,021,844 A | 2/2000 | Batchelder |
| 6,027,791 A | 2/2000 | Higashi et al. |
| 6,028,619 A | 2/2000 | Saita et al. |
| 6,039,896 A | 3/2000 | Miyamoto et al. |
| 6,048,656 A | 4/2000 | Akram et al. |
| 6,087,018 A | 7/2000 | Uchiyama |
| 6,110,656 A | 8/2000 | Eichorst et al. |
| 6,121,175 A | 9/2000 | Drescher et al. |
| 6,124,224 A | 9/2000 | Sridharan et al. |
| 6,159,910 A | 12/2000 | Shimizu et al. |
| 6,356,334 B1 | 3/2002 | Mathew et al. |
| 6,370,015 B2 | 4/2002 | Noda et al. |
| 6,423,415 B1 | 7/2002 | Greene et al. |
| 6,451,283 B1 | 9/2002 | Kuznicki et al. |
| 6,452,090 B2 | 9/2002 | Takato et al. |
| 6,486,087 B1 | 11/2002 | Saling et al. |
| 6,496,359 B2 | 12/2002 | Clark et al. |
| 6,541,083 B1 | 4/2003 | Landa et al. |
| 6,541,832 B2 | 4/2003 | Coyle |
| 6,586,087 B2 | 7/2003 | Young |
| 6,586,675 B1 * | 7/2003 | Bealka et al. .......... 174/50.56 |
| 6,599,643 B2 | 7/2003 | Heimann et al. |
| 6,617,041 B2 | 9/2003 | Hahn et al. |
| 6,624,276 B2 | 9/2003 | Lamers et al. |
| 6,658,861 B1 | 12/2003 | Ghoshal et al. |
| 6,663,793 B2 | 12/2003 | Parkhill et al. |
| 6,664,567 B2 | 12/2003 | Kyoda et al. |
| 6,665,186 B1 | 12/2003 | Calmidi et al. |
| 6,708,501 B1 | 3/2004 | Ghoshal et al. |
| 6,768,629 B1 * | 7/2004 | Allen et al. .......... 361/302 |
| 6,798,072 B2 | 9/2004 | Kajiwara et al. |
| 6,800,326 B1 | 10/2004 | Uchiyama |
| 6,800,330 B2 | 10/2004 | Hayashi et al. |
| 6,844,023 B2 * | 1/2005 | Schulman et al. .......... 427/2.24 |
| 6,918,984 B2 | 7/2005 | Murray et al. |
| 6,960,878 B2 | 11/2005 | Sakano et al. |
| 6,986,859 B2 | 1/2006 | Mazany et al. |
| 7,045,905 B2 | 5/2006 | Nakashima |
| 7,078,263 B2 | 7/2006 | Dean |
| 7,114,251 B2 | 10/2006 | Mashino |
| 7,131,286 B2 | 11/2006 | Ghoshal et al. |
| 7,175,937 B2 | 2/2007 | Cho et al. |
| 7,176,564 B2 | 2/2007 | Kim |
| 7,202,598 B2 | 4/2007 | Juestel et al. |
| 7,265,977 B2 | 9/2007 | Martin et al. |
| 7,293,416 B2 | 11/2007 | Ghoshal |
| 7,296,417 B2 | 11/2007 | Ghoshal |
| 7,297,206 B2 | 11/2007 | Naruse et al. |
| 7,307,286 B2 | 12/2007 | Ito et al. |
| 7,327,039 B2 | 2/2008 | Charles et al. |
| 7,340,904 B2 | 3/2008 | Sauciuc et al. |
| 7,342,787 B1 | 3/2008 | Bhatia |
| 7,348,665 B2 | 3/2008 | Sauciuc et al. |
| 7,365,984 B2 | 4/2008 | Jeong |
| 7,391,060 B2 | 6/2008 | Oshio |
| 7,441,087 B2 | 10/2008 | Hakura et al. |
| 7,473,460 B2 | 1/2009 | Meguro et al. |
| 7,476,981 B2 | 1/2009 | Bergmann et al. |
| 7,491,431 B2 | 2/2009 | Chiruvolu et al. |
| 7,497,961 B2 | 3/2009 | Keenan et al. |
| 7,651,556 B2 | 1/2010 | Komiyama et al. |
| 7,671,468 B2 | 3/2010 | Kanazawa et al. |
| 7,692,259 B2 | 4/2010 | Suehiro |
| 7,709,093 B2 | 5/2010 | Makowski et al. |
| 7,737,356 B2 | 6/2010 | Goldstein |
| 7,910,403 B2 | 3/2011 | Hirano et al. |
| 7,915,527 B1 | 3/2011 | Lower et al. |
| 7,985,392 B2 | 7/2011 | Hayashi et al. |
| 8,075,185 B2 | 12/2011 | Hecht et al. |
| 8,076,185 B1 * | 12/2011 | Lower et al. .......... 438/127 |
| 8,084,855 B2 | 12/2011 | Lower et al. |
| 8,119,040 B2 | 2/2012 | Lower et al. |
| 8,174,830 B2 | 5/2012 | Lower et al. |
| 8,581,108 B1 | 11/2013 | Boone et al. |
| 8,617,913 B2 | 12/2013 | Lower et al. |
| 2001/0015443 A1 | 8/2001 | Komoto |
| 2001/0030493 A1 | 10/2001 | Noda et al. |
| 2001/0033012 A1 | 10/2001 | Kommerling et al. |
| 2001/0046933 A1 | 11/2001 | Parkhill et al. |
| 2002/0000630 A1 | 1/2002 | Coyle |
| 2002/0054976 A1 | 5/2002 | Nakamura et al. |
| 2002/0076192 A1 | 6/2002 | Bartholomew et al. |
| 2002/0078856 A1 | 6/2002 | Hahn et al. |
| 2002/0086115 A1 | 7/2002 | Lamers et al. |
| 2002/0170173 A1 | 11/2002 | Mashino |
| 2002/0189495 A1 | 12/2002 | Hayashi et al. |
| 2002/0189894 A1 | 12/2002 | Davis et al. |
| 2003/0047735 A1 | 3/2003 | Kyoda et al. |
| 2003/0080341 A1 | 5/2003 | Sakano et al. |
| 2003/0218258 A1 | 11/2003 | Charles et al. |
| 2003/0228424 A1 | 12/2003 | Dove et al. |
| 2004/0106037 A1 | 6/2004 | Cho et al. |
| 2004/0116577 A1 | 6/2004 | Naruse et al. |
| 2004/0156995 A1 | 8/2004 | Komiyama et al. |
| 2004/0194667 A1 | 10/2004 | Reuscher |
| 2005/0003947 A1 | 1/2005 | Mazany et al. |
| 2005/0082691 A1 | 4/2005 | Ito et al. |
| 2005/0099775 A1 | 5/2005 | Pokharna et al. |
| 2005/0116237 A1 | 6/2005 | Voutsas |
| 2005/0123684 A1 | 6/2005 | Makowski et al. |
| 2005/0133863 A1 | 6/2005 | Werner et al. |
| 2005/0179742 A1 | 8/2005 | Keenan et al. |
| 2006/0045755 A1 | 3/2006 | McDonald et al. |
| 2006/0068218 A1 | 3/2006 | Hooghan et al. |
| 2006/0095677 A1 | 5/2006 | Hakura et al. |
| 2006/0113066 A1 | 6/2006 | Mongia et al. |
| 2006/0135342 A1 | 6/2006 | Anderson et al. |
| 2006/0158849 A1 | 7/2006 | Martin et al. |
| 2006/0210790 A1 | 9/2006 | Horio et al. |

(56) References Cited

U.S. PATENT DOCUMENTS

| | | | |
|---|---|---|---|
| 2006/0250731 | A1 | 11/2006 | Parkhurst et al. |
| 2006/0268525 | A1 | 11/2006 | Jeong |
| 2006/0283546 | A1 | 12/2006 | Tremel et al. |
| 2007/0075323 | A1 | 4/2007 | Kanazawa et al. |
| 2007/0102833 | A1 | 5/2007 | Hack et al. |
| 2007/0108586 | A1 | 5/2007 | Uematsu et al. |
| 2007/0224400 | A1 | 9/2007 | Meguro et al. |
| 2008/0006204 | A1 | 1/2008 | Rusinko et al. |
| 2008/0050512 | A1 | 2/2008 | Lower et al. |
| 2008/0063875 | A1 | 3/2008 | Robinson et al. |
| 2008/0142966 | A1 | 6/2008 | Hirano et al. |
| 2008/0299300 | A1 | 12/2008 | Wilcoxon et al. |
| 2009/0110904 | A1 | 4/2009 | Mack et al. |
| 2009/0183774 | A1 | 7/2009 | Atanackovic |
| 2009/0246355 | A9 | 10/2009 | Lower et al. |
| 2010/0064518 | A1 | 3/2010 | Lower et al. |
| 2010/0064695 | A1 | 3/2010 | Wilcoxon et al. |
| 2010/0065256 | A1 | 3/2010 | Wilcoxon et al. |
| 2010/0066178 | A1 | 3/2010 | Lower et al. |
| 2012/0118623 | A1 | 5/2012 | Lower et al. |

FOREIGN PATENT DOCUMENTS

| | | |
|---|---|---|
| JP | 57-027942 | 2/1985 |
| JP | 02-064071 | 3/1990 |
| JP | 11-095246 | 4/1994 |
| JP | 2003-332505 | 11/2003 |
| JP | 2006-045420 | 2/2006 |
| WO | WO 2006/095677 | 9/2006 |

OTHER PUBLICATIONS

Notice of Allowance for U.S. Appl. No. 13/359,105, mail date Jun. 24, 2013, 9 pages.
Office Action for U.S. Appl. No. 13/329,068, mail date Jun. 7, 2013, 6 pages.
International Search Report and Written Opinion for International Application No. PCT/US2008/074224, mail Jan. 30, 2009, 9 pages.
Notice of Allowance for U.S. Appl. No. 12/493,022, mail date Sep. 20, 2012, 5 pages.
Notice of Allowance for U.S. Appl. No. 11/732,982, mail date Nov. 8, 2012, 8 pages.
Office Action for U.S. Appl. No. 11/959,225, mail date Nov. 18, 2011, 17 pages.
Office Action for U.S. Appl. No. 12/240,775, mail date Apr. 2, 2012, 8 pages.
Office Action for U.S. Appl. No. 13/359,105, mail date May 8, 2012, 12 pages.
Office Action for U.S. Appl. No. 12/240,775, mail date Sep. 6, 2012, 9 pages.
Office Action for U.S. Appl. No. 11/959,225, mail date Sep. 25, 2012, 16 pages.
Office Action for U.S. Appl. No. 13/359,105, mail date Oct. 19, 2012, 7 pages.
Office Action for U.S. Appl. No. 11/959,225, mail date Apr. 23, 2013, 6 pages.
U.S. Appl. No. 11/508,782, filed Aug. 23, 2006, Lower et al.
U.S. Appl. No. 11/732,981, filed May 4, 2007, Wilcoxon et al.
U.S. Appl. No. 11/732,982, filed Apr. 5, 2007, Boone et al.
U.S. Appl. No. 11/784,932, filed Apr. 4, 2007, Lower et al.
U.S. Appl. No. 11/959,225, filed Dec. 18, 2007, Lower et al.
U.S. Appl. No. 12/116,126, filed May 6, 2008, Lower et al.
U.S. Appl. No. 12/240,775, filed Sep. 29, 2008, Lower et al.
U.S. Appl. No. 12/284,670, filed Sep. 24, 2008, Cripe et al.
U.S. Appl. No. 12/286,207, filed Sep. 29, 2008, Lower et al.
U.S. Appl. No. 12/493,022, Jun. 26, 2009, Sampica et al.
Bonding and Coating Applications of PQ® Soluble Silicates, Bulletin 12-31, PQ Corporation, 2003, 7 pages.
Click et al., "Schott Low Temperature Bonding for Precision Optics," website: http://optics.nasa.gov/tech_days/tech_days_2004/docs/18%20Aug%202004/23%20Schott%20Low%20Temperature%20Bonding.pdf, 20 pages.
Golubev, K.S., et al., Modeling of Acid-Base Properties of Binary Alkali-Silicate Melts, Rev. Adv. Mater. Sci. 6, (2004), pp. 33-40, website: http://www.ipme.ru/e-journals/Rams/no_1604/golubev/golubev.pdf.
International Search Report and Written Opinion for Application No. PCT/US2009/031699, mail date Aug. 18, 2009, 16 pages.
International Search Report and Written Opinion for Application No. PCT/US2009/036355, date of mailing Jun. 30, 2009, 11 pages.
International Search Report and Written Opinion for International Application No. PCT/US2008/075591, mail date Apr. 8, 2009, 7 pages.
Kennedy, C. R., Strength and Fracture Toughness of Binary Alkali Silicate Glasses (Abstract only), Feb. 14, 1974, website: http://oai.dtic.mil/oai/oai?verb=getRecord&metadataPrefix=html&identifier=ADA016820, 1 page.
Lewis, J. A., et al., Materialstoday: Jul./Aug. 2004, Direct Writing in three dimension, ISSN: 1369 7021© Elsevier Ltd 2004, pp. 32-39.
Mysen, B. et al. Silicate Glasses and Melts, vol. 10: Properties and Structure (Developments in Geochemistry) (Book Description), website: http://www.amazon.com/Silicate-Glasses-Melts-Developments-Geochemistry/dp/0444520112, 4 pgs, downloaded Dec. 3, 2010.
Nascimento, M. L. F., et al. Universal curve of ionic conductivities in binary alkali silicate glasses, Journal of Materials Science (2005), Springer Science + Business Media, Inc., website: http://www.springerlink.com/content/p7535075x1872016/, 3 pgs.
Office Action for U.S. Appl. No. 11/784,932, mail date Apr. 3, 2009, 8 pages.
Office Action for U.S. Appl. No. 11/508,782, mail date Jun. 16, 2009, 13 pages.
Office Action for U.S. Appl. No. 12/116,126, mail date Nov. 20, 2009, 7 pages.
Office Action for U.S. Appl. No. 11/959,225, mail date Dec. 2, 2009, 15 pages.
Office Action for U.S. Appl. No. 11/784,932, mail date Feb. 16, 2010, 11 pages.
Office Action for U.S. Appl. No. 11/508,782, mail date Feb. 24, 2010, 12 pages.
Office Action for U.S. Appl. No. 12/116,126, mail date Apr. 22, 2010, 7 pages.
Office Action for U.S. Appl. No. 11/959,225, mail date May 26, 2010, 16 pages.
Office Action for U.S. Appl. No. 11/508,782, mail date Sep. 2, 2010, 14 pages.
Office Action for U.S. Appl. No. 12/284,670, mail date Sep. 28, 2010, 11 pages.
Office Action for U.S. Appl. No. 11/732,981, mail date Oct. 6, 2010, 10 pages.
Office Action for U.S. Appl. No. 12/116,126, mail date Oct. 25, 2010, 9 pages.
Office Action for U.S. Appl. No. 11/959,225, mail date Oct. 27, 2010, 12 pages.
Office Action for U.S. Appl. No. 11/784,932, mail date Nov. 10, 2010, 10 pages.
Office Action for U.S. Appl. No. 12/286,207, mail date Dec. 27, 2010, 15 pages.
Office Action for U.S. Appl. No. 11/508,782, mail date Jan. 19, 2011, 10 pages.
Office Action for U.S. Appl. No. 11/732,982, mail date Feb. 2, 2011, 16 pages.
Office Action for U.S. Appl. No. 12/284,670, mail date Feb. 17, 2011, 12 pages.
Office Action for U.S. Appl. No. 12/116,126, mail date Feb. 25, 2011, 9 pages.
Office Action for U.S. Appl. No. 11/732,981, mail date Mar. 16, 2011, 7 pages.
Office Action for U.S. Appl. No. 11/959,225, mail date Apr. 13, 2011, 17 pages.

(56) References Cited

OTHER PUBLICATIONS

Office Action for U.S. Appl. No. 12/116,126, mail date May 10, 2011, 8 pages.
Office Action for U.S. Appl. No. 12/240,775, mail date May 26, 2011, 10 pages.
Pedone, A., et al. Insight into Elastic Properties of Binary Alkali Silicate Glasses; Prediction and Interpretation through Atomistic Simulation Techniques, Chemistry of Materials, 2007, vol. 19, No. 13, pp. 3144-3154, American Chemical Society (Abstract only) website: http://pubs.acs.org/doi/abs/10.1021/cm062619r, 2 pgs.
PQ® Soluble Silicates in Refractory and Chemical-Resistant Cements, Bulletin 24-1, PQ Corporation, 2003, 6 pages.
Optomec® Systems M3D® Breakthrough Technology for Printable Electronics, pp. 1-2.
Shermer, H. F., Thermal expansion of binary alkali silicate glasses, Journal of Research of the National Bureau of Standards, vol. 57, No. 2, Aug. 1956, Research Paper No. 2698, website: http://nvl.nist.gov/pub/nistpubs/jres/057/2/V57.N02.A05.pdf, 5 pgs.
The Mixed—Alkali Effect for the Viscosity of Glasses, printed on Dec. 3, 2010 from website: http://glassproperties.com/viscosity/mixed-alkali-effect-viscosity/, 7 pages.
The Structure of Glasses. Alkali silicate glasses, printed on Dec. 3, 2010 from website: http://www.ptc.tugraz.at/specmag/struct/ss.htm, 1 page.
Thresh, The Action of Natural Waters on Lead, The Analyst, Proceedings of the Society of Public Analysts and Other Analytical Chemists, Nov. 1922, pp. 459-468, vol. XLVII, No. 560.
Office Action for U.S. Appl. No. 13/287,734, mail date Sep. 11, 2013, 20 pages.
Notice of Allowance for U.S. Appl. No. 11/959,225, mail date Sep. 24, 2013, 9 pages.
Notice of Allowance for U.S. Appl. No. 13/329,068, mail date Oct. 17, 2013, 9 pages.
Non-Final Office Action on U.S. Appl. No. 13/287,734 Dated May 7, 2014, 35 pages.
Final Office Action on U.S. Appl. No. 13/287,734 Dated Aug. 27, 2014, 34 pages.
Notice of Allowance on U.S. Appl. No. 14/055,746 Dated Oct. 21, 2014, 8 pages.
Non-Final Office Action on U.S. Appl. No. 13/287,734 Dated Dec. 15, 2014, 32 pages.
Final Office Action on U.S. Appl. No. 13/287,734 Dated May 4, 2015, 25 pages.
Technical Standard Order, TSO-C115b, Airborne Area Navigation Equipment Using Multi-Sensor Inputs, Department of Transportation, Federal Aviation Administration, Sep. 30, 1994, 11 pages.
Techpowerup, "NanoCoolers puts liquid metal in your PC," website: http://www.techpowerup.com/?3105, May 4, 2005, 19 pages.
Notice of Allowance for U.S. Appl. No. 11/732,982, mail date Dec. 19, 2012, 2 pages.
Office Action for U.S. Appl. No. 13/287,734, mail date Apr. 11, 2013, 18 pages.
Office Action for U.S. Appl. No. 13/359,105, mail date Jan. 17, 2013, 7 pages.
Restriction Requirement for U.S. Appl. No. 13/329,068, mail date Jan. 15, 2013, 5 pages.
Non-Final Office Action on U.S. Appl. No. 14/140,192 Dated Jul. 20, 2015, 31 pages.
Notice of Allowance on U.S. Appl. No. 13/287,734 Dated Jul. 16, 2015, 12 pages.

\* cited by examiner

METHOD OF REINFORCING A HERMETIC SEAL OF A MODULE

CROSS-REFERENCE TO RELATED APPLICATIONS

This is a divisional application of application Ser. No. 11/784,158, filed Apr. 5, 2007, which is a continuation-in-part application of application Ser. No. 11/508,782, filed Aug. 23, 2006, both of which are herein incorporated by reference in their entireties.

FIELD OF THE INVENTION

The present invention relates generally to electronic packaging and more particularly to hermetic module reinforcement and repair with low temperature glass coatings.

BACKGROUND OF THE INVENTION

A hermetic seal is an airtight seal which is impermeable to water in the liquid or vapor state. Hermetically sealed electronics modules are components that are designed and intended to secure and maintain the safety and quality of their contents. Hermetically sealed modules may be sealed utilizing a variety of processes including soldering, brazing or diffusion bonding such as with an indium-tin bond. Electrical interconnect to these sealed modules is provided with hermetic connectors that typically include glass frits that surround the electrical conductor and provide a seal between the hermetic module housing and the conductor.

Although diffusion bonded seals typically perform very well, they have been found to occasionally leak after rigorous mechanical shock and vibration testing. The cause of the leaks is due to failure at the metallic seal, which can be gold-tin, indium-tin, etc. depending on the sealing method used. This failure is often related to the formation of brittle intermetallics (alloys of two or more metals in a certain proportion, forming a new chemical compound) and corrosion. In addition, stresses induced by thermal expansion mismatch between the module housing and the glass frits in hermetic connectors can cause cracks in the glass which break the hermetic seal and can allow moisture penetration. Attempts have been made to utilize varnish to seal these cracks, but varnish is not hermetic. Opportunities to improve or repair hermetic seals and hermetic connectors are limited due to the requirement to maintain relatively low bonding temperatures to avoid damaging the electronic components within the sealed module.

Consequently, it would be desirable to provide a simple, low-cost, low-processing temperature method for hermetic seal and hermetic connector reinforcement, repair, and corrosion protection.

SUMMARY OF THE INVENTION

Accordingly, the present invention is directed to a low-cost, low-processing temperature, and simple additional hermetic seal reinforcement, repair, and corrosion protection for hermetically sealed modules.

A thin layer of glass is applied over the seal (such as a seal produced by a low-temperature indium-tin diffusion bonding process) or over the glass frit of the hermetic connector of a hermetically sealed module. The layer of glass comprises an alkali silicate glass. The layer of glass is produced from an alkali silicate material which is a low viscosity liquid at room temperature prior to curing (room temperature may typically comprise a range between about sixteen degrees Celsius and about twenty-seven degrees Celsius). The material is cured at low temperatures of typically no more than about 160 degrees Celsius to produce the layer of glass. Higher temperatures may be utilized to reduce cure time. Subsequent to curing, the layer of glass is intimately bonded (tightly adhering) to the seal, watertight, and is stable from about negative two-hundred forty-three degrees Celsius to at least about seven-hundred twenty-seven degrees Celsius.

The present invention provides a method for low-cost, low-processing temperature, and simple additional hermetic seal and hermetic connector reinforcement, repair, and corrosion protection for hermetically sealed modules. The glass layer provides corrosion protection, seals any existing leaks, and possesses the flexibility and adhesion necessary to survive the high mechanical stresses of shock and vibration testing. The resulting bond between the glass layer and the seal of the module is hermetic with good aqueous durability and is stable at a wide range of temperatures. The strength of the bond is similar to that of monolithic structures. Seals that can be repaired in this manner include both the interfaces between metallic module housings and the interfaces between hermetic connector glass frits and a module housing.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to exemplary embodiments of the invention, examples of which are illustrated in the accompanying drawings.

Figure 1:
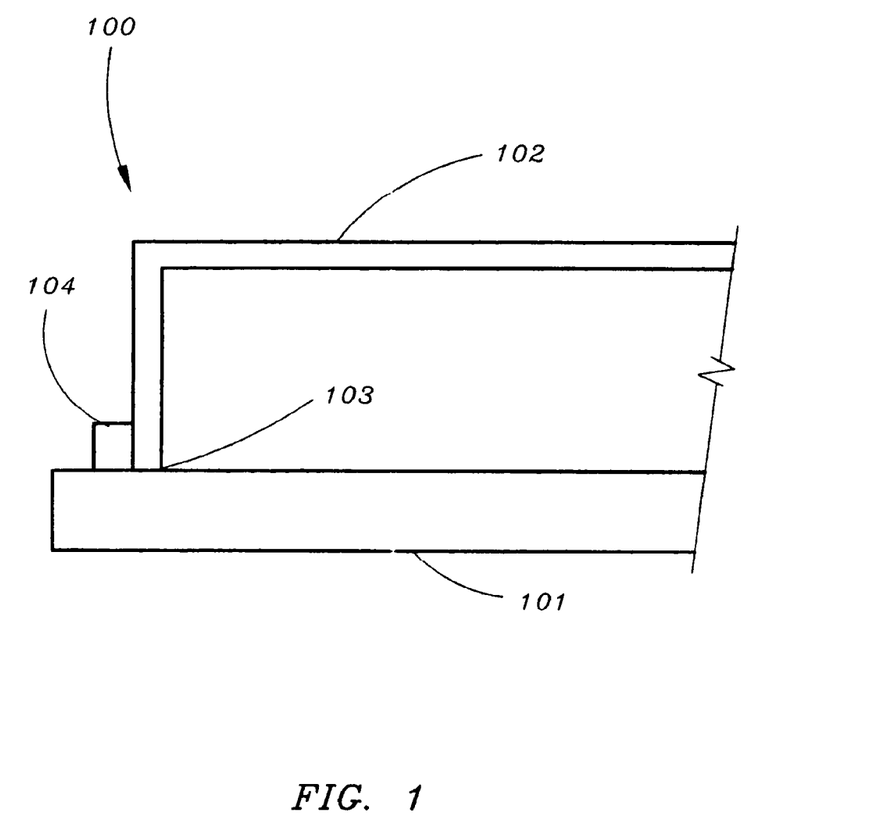
FIG. 1 is a block diagram illustrating a hermetically sealed module, in accordance with an exemplary embodiment of the present invention.

Referring generally to FIG. 1; a hermetically sealed module 100, in accordance with an exemplary embodiment of the present invention, is illustrated. The hermetically sealed module 100 includes a first housing portion 101 and a second housing portion 102. First housing portion 101 and second housing portion 102 are sealed together by seal 103. Seal 103 may be produced by a diffusion bonding process, such as a low-temperature indium-tin bonding process. Seal 103 may be a hermetic seal. Glass coating 104 coats seal 103.

Glass coating 104 may comprise a thin layer of alkali silicate glass as disclosed in co-pending and co-owned application "INTEGRATED CIRCUIT PROTECTION AND RUGGEDIZATION COATINGS AND METHODS" (application Ser. No. 11/508,782, filed Aug. 23, 2006). Glass coating 104 may have been applied to reinforce or repair the seal. The glass coating may be produced from material which is a low viscosity liquid at room temperature prior to curing (room temperature may comprise a range between about sixteen degrees Celsius and about twenty-seven degrees Celsius). The material may be an alkali silicate material. The material may be an alkali silicate material produced by fusing various proportions of sand ($SiO_2$) and alkali carbonate ($M_2CO_3$). The material may be an alkali silicate material with a $SiO_2/M_2O$ ratio of greater than or equal to about 2.5. The material may be an alkali silicate material with a $SiO_2/M_2O$ ratio of greater than or equal to about 4. The material may be an alkali silicate/water solution. The material may be an alkali silicate material with nanoparticle modifiers including, but not limited to, nano calcium carbonate, nano zinc oxide, and/or nano silicon dioxide. The material may be cured to produce the glass coating at low temperatures of typically no more than about 160 degrees Celsius. Subsequent to curing, the glass coating 104 is intimately bonded (tightly adhering) to seal 103, watertight, and may be stable from about negative two-hundred forty-three degrees Celsius to at least about seven-hundred twenty-seven degrees Celsius.

In alternative embodiments, the hermetically sealed module 100 may include less than two housing portions sealed by seal 103, which is coated with glass coating 104. In other alternative embodiments, the hermetically sealed module 100 may include more than two housing portions sealed by seal 103, which is coated with glass coating 104. In still further alternative embodiments, the hermetically sealed module may include any sort of housing sealed by seal 103, which is coated with glass coating 104, without departing from the scope of the present invention.

Figure 2:
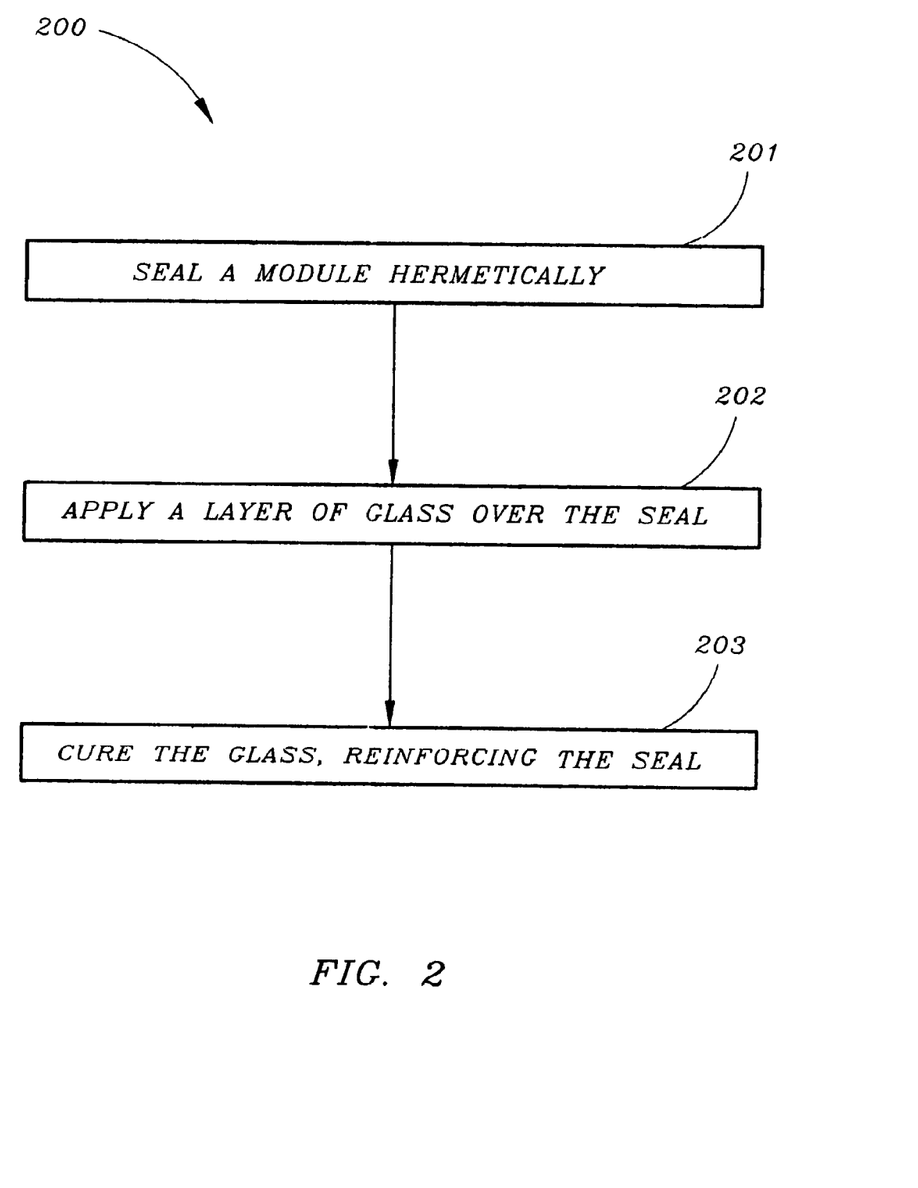
FIG. 2 is a flow chart illustrating a method of reinforcing and repairing a hermetic seal for a module, in accordance with an exemplary embodiment of the present invention.

Referring now to FIG. 2 a method 200 of reinforcing and repairing a hermetic seal for a module, in accordance with an exemplary embodiment of the present invention, is shown. In step 201, a module is sealed hermetically. In step 202, a layer of glass is applied over the seal. In step 203, the glass is cured, reinforcing and repairing the seal.

The seal may be produced by a metallurgic bonding process, such as a low-temperature indium-tin bonding process. Alternatively, the seal may be produced by a layer of glass. The layer of glass may comprise a thin layer of alkali silicate glass as disclosed in co-pending and co-owned application "INTEGRATED CIRCUIT PROTECTION AND RUGGEDIZATION COATINGS AND METHODS" (application Ser. No. 11/508,782, filed Aug. 23, 2006). The layer of glass may be produced from a material which is a low viscosity liquid at room temperature prior to curing (room temperature may comprise a range between about sixteen degrees Celsius and about twenty-seven degrees Celsius). The material may be an alkali silicate material. The material may be an alkali silicate material produced by fusing various proportions of sand ($SiO_2$) and alkali carbonate ($M_2CO_3$). The material may be an alkali silicate material with a $SiO_2/M_2O$ ratio of greater than or equal to about 2.5. The material may be an alkali silicate material with a $SiO_2/M_2O$ ratio of greater than or equal to about 4. The material may be an alkali silicate/water solution. The material may be an alkali silicate material with nanoparticle modifiers including, but not limited to, nano calcium carbonate, nano zinc oxide, and nano silicon dioxide. The material may be cured to produce the layer of glass at low temperatures of typically no more than about 160 degrees Celsius. Subsequent to curing, the layer of glass is intimately bonded (tightly adhering) to the seal, watertight, and may be stable from about negative two-hundred forty-three degrees Celsius to at least about seven-hundred twenty-seven degrees Celsius.

Figure 3:
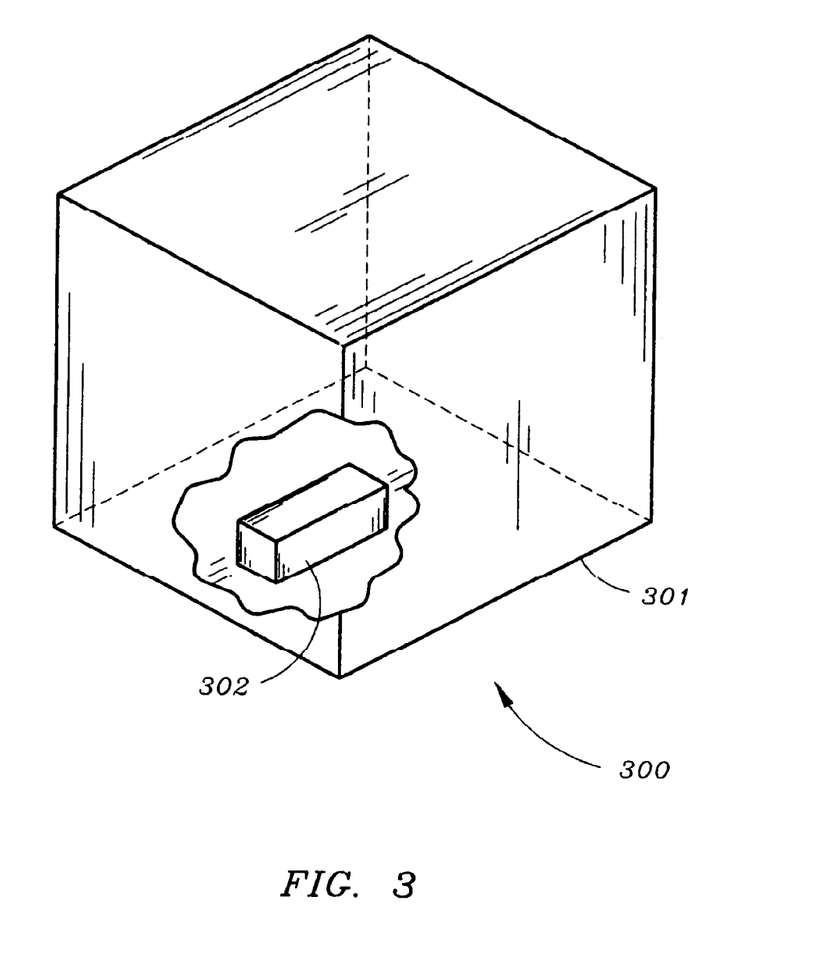
FIG. 3 is a block diagram illustrating an electronic device which includes a hermetically sealed module, in accordance with an alternative embodiment of the present invention.

Referring now to FIG. 3, an electronic device 300 including a hermetically sealed module 302, in accordance with an alternate embodiment of the present invention, is shown. Electronic device 300 includes a structure 301. The hermetically sealed module 302 is incorporated into the structure 302. Electronic device 300 may be any sort of electronic device which may include a hermetically sealed module, including but not limited to: a hermetic connector, an avionics system, a computing device, a rocket, a transportation device, a satellite, an optical device, a radio-frequency device, a data storage device, a component device, a data/signal processing device, a climate-control device, a transmitting/receiving device, and a communications device.

The hermetically sealed module 302 includes a seal which is coated with a glass coating. The seal may be produced by a diffusion bonding process, such as a low-temperature indium-tin bonding process. Alternatively, the seal may be produced by a layer of glass. The glass coating may have been applied to reinforce or repair the seal. The glass coating may comprise a thin layer of alkali silicate glass as disclosed in co-pending and co-owned application "INTEGRATED CIRCUIT PROTECTION AND RUGGEDIZATION COATINGS AND METHODS" (application Ser. No. 11/508,782, filed Aug. 23, 2006). The glass coating may be produced from a material which is a low viscosity liquid at room temperature prior to curing (room temperature may comprise a range between about sixteen degrees Celsius and about twenty-seven degrees Celsius). The material may be an alkali silicate material. The material may be an alkali silicate material produced by fusing various proportions of sand ($SiO_2$) and alkali carbonate ($M_2CO_3$). The material may be an alkali silicate material with a $SiO_2/M_2O$ ratio of greater than or equal to about 2.5. The material may be an alkali silicate material with a $SiO_2/M_2O$ ratio of greater than or equal to about 4. The material may be an alkali silicate/water solution. The material may be an alkali silicate material with nanoparticle modifiers including, but not limited to, nano calcium carbonate, nano zinc oxide, and nano silicon dioxide. The material may be cured to produce the glass coating at low temperatures of typically no more than about 160 degrees Celsius. Subsequent to curing, the glass coating is intimately bonded (tightly adhering) to the seal, watertight, and may be stable from about negative two-hundred forty-three degrees Celsius to at least about seven-hundred twenty-seven degrees Celsius.

Figure 4:
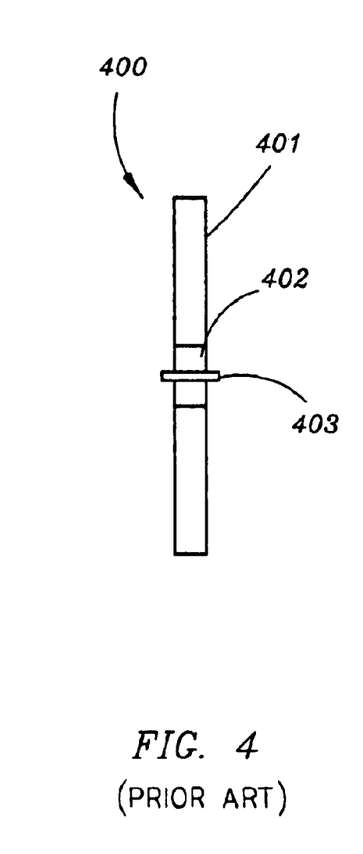
FIG. 4 is a side view block diagram illustrating a hermetic connector, as is known in the art.
Figure 5:
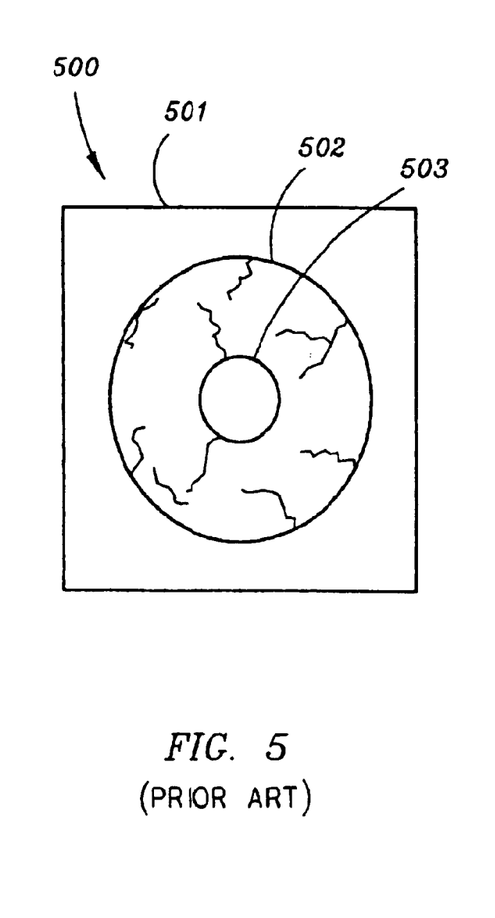
FIG. 5 is a front detail view block diagram illustrating a hermetic connector, as is known in the art.

Referring now to FIG. 4, a hermetic connector 400 (as is known in the art) including a housing 401, a glass frit 402, and an electrical passthrough 403, is shown. Referring now to FIG. 5, a hermetic connector 500 (as is known in the art) including a housing 501, a glass frit 502, and an electrical passthrough 503, is shown. Glass frit 502 includes cohesive cracks (within glass frit 502) and adhesive cracks (between housing 501 and glass frit 502) formed due to thermal and dynamic stresses. Cohesive fractures (cracks) are failures characterized by the body of a sealant or adhesive pulling apart. Adhesive fractures are failures characterized by the adhesive or sealant pulling loose from the adherend.

Figure 6:
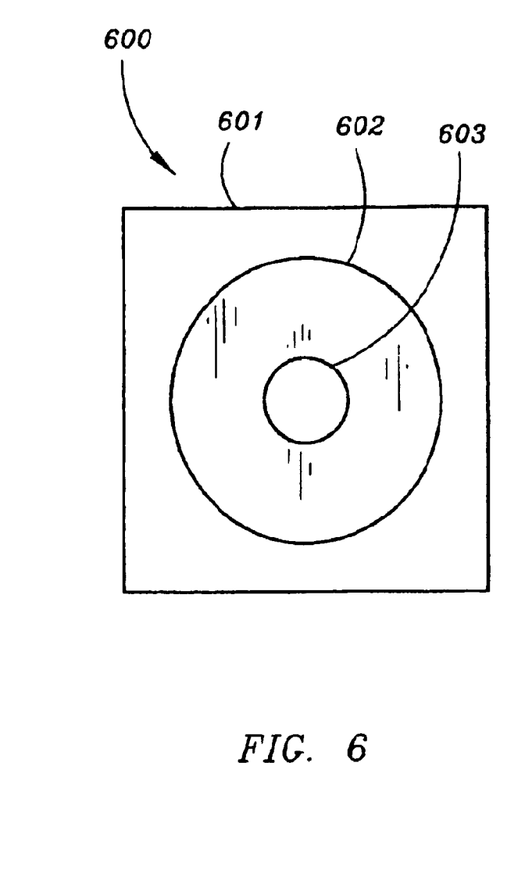
FIG. 6 is front detail view block diagram illustrating a hermetic connector, in accordance with an alternative embodiment of the present invention.

Referring now to FIG. 6, a hermetic connector 600 including a housing 601, a glass frit 602, and an electrical passthrough 603, in accordance with an alternative embodiment of the present invention, is shown. A layer of glass has been applied to the surface of glass frit 602, repairing cracks present in glass frit 602. As illustrated, the layer of glass has been applied over the entire surface of glass frit 602. However, the layer of glass may be applied over only a portion of the surface of glass frit 602 without departing from the scope of the present invention. The layer of glass may be applied to individual cracks in glass frit 602 or even portions of individual cracks of glass frit 602.

The layer of glass may comprise a thin layer of alkali silicate glass as disclosed in co-pending and co-owned application "INTEGRATED CIRCUIT PROTECTION AND RUGGEDIZATION COATINGS AND METHODS" (application Ser. No. 11/508,782, filed Aug. 23, 2006). The layer of glass may be produced from a material which is a low viscosity liquid at room temperature prior to curing (room temperature may comprise a range between about sixteen degrees Celsius and about twenty-seven degrees Celsius). The material may be an alkali silicate material. The material may be an alkali silicate material produced by fusing various proportions of sand ($SiO_2$) and alkali carbonate ($M_2CO_3$). The material may be an alkali silicate material with a $SiO_2/M_2O$ ratio of greater than or equal to about 2.5. The material may be an alkali silicate material with a $SiO_2/M_2O$ ratio of greater than or equal to about 4. The material may be an alkali silicate/water solution. The material may be an alkali silicate material with nanoparticle modifiers including, but not limited to, nano calcium carbonate, nano zinc oxide, and nano silicon dioxide. The material may be cured to produce the layer of glass at low temperatures of typically no more than about 160 degrees Celsius. Subsequent to curing, the layer of glass is intimately bonded (tightly adhering) to the seal, watertight, and may be stable from about negative two-hundred forty-three degrees Celsius to at least about seven-hundred twenty-seven degrees Celsius.

Figure 7:
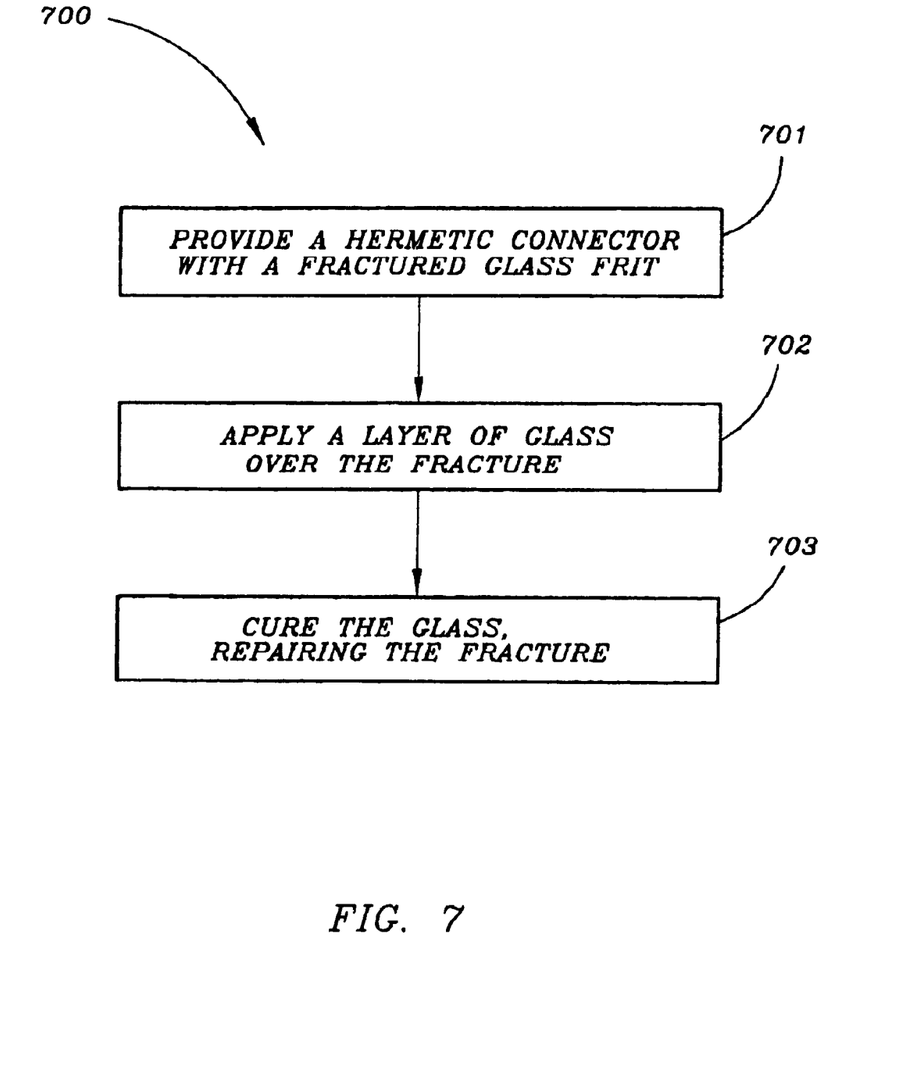
FIG. 7 is a flow chart illustrating a method of repairing a hermetic connector, in accordance with an exemplary embodiment of the present invention.

Referring now to FIG. 7, a method 700 of repairing a hermetic connector, in accordance with an exemplary embodiment of the present invention, is shown. In step 701, a hermetic connector, which includes a fractured glass frit, is provided. In step 702, a layer of glass is applied over the fracture. In step 703, the layer of glass is cured, repairing the fracture.

The layer of glass may comprise a thin layer of alkali silicate glass as disclosed in co-pending and co-owned application "INTEGRATED CIRCUIT PROTECTION AND RUGGEDIZATION COATINGS AND METHODS" (application Ser. No. 11/508,782, filed Aug. 23, 2006). The layer of glass may be produced from a material which is a low viscosity liquid at room temperature prior to curing (room temperature may comprise a range between about sixteen degrees Celsius and about twenty-seven degrees Celsius). The material may be an alkali silicate material. The material may be an alkali silicate material produced by fusing various proportions of sand ($SiO_2$) and alkali carbonate ($M_2CO_3$). The material may be an alkali silicate material with a $SiO_2/M_2O$ ratio of greater than or equal to about 2.5. The material may be an alkali silicate material with a $SiO_2/M_2O$ ratio of greater than or equal to about 4. The material may be an alkali silicate/water solution. The material may be an alkali silicate material with nanoparticle modifiers including, but not limited to, nano calcium carbonate, nano zinc oxide, and nano silicon dioxide. The material may be cured to produce the layer of glass at low temperatures of typically no more than about 160 degrees Celsius. Subsequent to curing, the layer of glass is intimately bonded (tightly adhering) to the seal, watertight, and may be stable from about negative two-hundred forty-three degrees Celsius to at least about seven-hundred twenty-seven degrees Celsius.

The present invention provides low-cost, low-processing temperature, and simple additional hermetic seal and hermetic connector reinforcement, repair, and corrosion protection for hermetically sealed modules. The glass coating or layer provides corrosion protection, seals any existing leaks, and possesses the good flexibility and adhesion necessary to survive the high mechanical stresses of shock and vibration testing. The resulting bond between the glass coating or layer and the seal of the module is hermetic with good aqueous durability and is stable at a wide range of temperatures. The strength of the bond is similar to that of monolithic structures.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

The invention claimed is:

1. A method of reinforcing or repairing a hermetic seal for a module, comprising the steps of:
   sealing a module hermetically;
   applying a material comprising an alkali silicate over the seal; and
   curing the material to form an alkali silicate glass, which performs one selected from reinforcing the seal and repairing the seal, wherein the curing takes place at temperatures of no more than about one-hundred sixty degrees Celsius.

2. The method of claim 1, wherein the material is a low viscosity liquid at a temperature between about sixteen degrees Celsius and about twenty-seven degrees Celsius prior to curing.

3. The method of claim 1, wherein the seal is a metallurgical seal.

4. The method of claim 1, wherein the seal includes at least one fracture caused by one selected from a cohesive failure and an adhesive failure.

5. The method of claim 1, wherein the material comprises $SiO_2$ and $M_2O$, wherein $M_2O$ is an alkali oxide.

6. The method of claim 1, wherein the alkali silicate glass is configured to seal any existing leaks in the seal from at least one of a cohesive fracture and an adhesive fracture.

7. The method of claim 1, wherein the module comprises a housing portion, wherein the sealing comprises producing a seal in contact with the housing portion, wherein the applying comprises coating the seal.

8. The method of claim 1, wherein the alkali silicate glass has a $SiO_2/M_2O$ ratio, wherein $M_2O$ is an alkali oxide comprising an alkali metal.

9. A method of repairing a hermetic connector, comprising the steps of:
   providing the hermetic connector which includes a glass frit with at least one fracture;
   applying a material containing an alkali silicate over the at least one fracture of the glass frit; and
   curing the material to form an alkali silicate glass, which repairs the at least one fracture of the glass frit.

10. The method of claim 9, wherein the material is a low viscosity liquid at a temperature between about sixteen degrees Celsius and about twenty-seven degrees Celsius prior to curing.

11. The method of claim 9, wherein the curing takes place at temperatures of no more than about one-hundred sixty degrees Celsius.

12. The method of claim 9 wherein the at least one fracture in the glass frit was caused by one selected from a cohesive failure and an adhesive failure.

13. The method of claim 9, wherein the glass is applied over an entire surface of the glass frit.

14. The method of claim 9, wherein the hermetic connector comprises a housing which is connected to the glass frit, the glass frit connected to an electrical feedthrough, wherein the glass is applied over an entire surface of the glass frit, wherein the curing seals the at least one fracture.

15. The method of claim 9, wherein the alkali silicate glass has a $SiO_2/M_2O$ ratio, wherein $M_2O$ is an alkali oxide comprising an alkali metal.

16. A method of reinforcing a hermetically sealed module with an alkali silicate glass, comprising:
   providing a module, the module comprising a housing portion and a hermetic seal, wherein the hermetic seal is in contact with the housing portion and comprises a glass frit;
   coating the glass frit of the hermetic seal with a material comprising an alkali silicate; and
   curing the material to form an alkali silicate glass to reinforce the hermetic seal.

17. The method of claim 16, wherein the alkali silicate glass has a $SiO_2/M_2O$ ratio, wherein $M_2O$ is an alkali oxide comprising an alkali metal.

18. The method of claim 16, wherein the hermetic seal is a metallurgical seal.

19. The method of claim 16, wherein the module is one of a satellite or an optical device.

* * * * *